March 7, 1967 G. T. DE SHONG 3,307,244

METHOD OF APPLYING TERMINAL PINS TO PRINTED CIRCUIT BOARDS

Filed May 25, 1964 8 Sheets-Sheet 1

INVENTOR.
George T. DeShong
BY
Balluff and McKinley
ATTORNEYS.

METHOD OF APPLYING TERMINAL PINS TO PRINTED CIRCUIT BOARDS

Filed May 25, 1964

INVENTOR.
George T. DeShong.
BY
Balluff and McKinley
ATTORNEYS.

METHOD OF APPLYING TERMINAL PINS TO PRINTED CIRCUIT BOARDS

Filed May 25, 1964 8 Sheets-Sheet 3

INVENTOR.
George T. DeShong.
BY
Balluff and McKinley
ATTORNEYS.

METHOD OF APPLYING TERMINAL PINS TO PRINTED CIRCUIT BOARDS

Filed May 25, 1964 8 Sheets-Sheet 4

INVENTOR.
George T. De Shong
BY
Balluff and McKinley
ATTORNEYS.

METHOD OF APPLYING TERMINAL PINS TO PRINTED CIRCUIT BOARDS

Filed May 25, 1964 8 Sheets-Sheet 5

INVENTOR.
George T. DeShong.
BY
Balluff and McKinley
ATTORNEYS.

March 7, 1967 G. T. DE SHONG 3,307,244

METHOD OF APPLYING TERMINAL PINS TO PRINTED CIRCUIT BOARDS

Filed May 25, 1964 8 Sheets-Sheet 6

INVENTOR.
George T. DeShong.
BY
Balluff and McKinley
ATTORNEYS.

METHOD OF APPLYING TERMINAL PINS TO PRINTED CIRCUIT BOARDS

Filed May 25, 1964 8 Sheets-Sheet 7

INVENTOR.
George T. DeShong
BY
Balluff and McKinley
ATTORNEYS.

METHOD OF APPLYING TERMINAL PINS TO PRINTED CIRCUIT BOARDS

Filed May 25, 1964

INVENTOR.
George T. DeShong.
BY
Balluff and McKinley
ATTORNEYS.

United States Patent Office 3,307,244

Patented Mar. 7, 1967

3,307,244
METHOD OF APPLYING TERMINAL PINS TO PRINTED CIRCUIT BOARDS

George T. De Shong, Camp Hill, Pa., assignor to Berg Electronics, Inc., New Cumberland, Pa., a corporation of Pennsylvania Filed May 25, 1964, Ser. No. 369,789
6 Claims. (Cl. 29—155.5)

This invention relates to techniques for applying terminals to circuit elements, and has particular reference to an efficient method of applying terminal pins to printed circuit boards.

Conventional techniques for inserting a series of terminal pins in the holes of a circuit board are inefficient and less than satisfactory for a number of reasons, one of which is the difficulty of lining up a hole in the board with a pin. According to my invention, I provide an air-operated press type apparatus which projects the lead end of the pin downwardly so that it is free and accessible whereby the operator can see such lead end and utilize it as a fixed guide while shifting a circuit board below the pin for piloting the hole in the board on the pin and, while the pin is supported, moving the board axially of the pin so as to force the hole in the board over the main diameter portion of the pin, and then while the board is held by the press, driving the pin into the hole in the board so as to accurately position the pin in the hole. My invention not only reduces the time and labor involved in applying terminal pins, but also supports the pin during insertion so that the inserted pins are more accurately and uniformly located relative to the board than is possible with conventional manual methods.

A principal object of the invention, therefore, is to provide a novel and efficient method of applying terminal pins to printed circuit boards;

Other and further objects of the invention will be apparent from the following description and claims and may be understood by reference to the accompanying drawings, of which there are eight sheets, which by way of illustration show a preferred embodiment of the invention and what I now consider to be the best mode of applying the principles thereof. Other embodiments of the invention may be used without departing from the scope of the present invention as set forth in the appended claims.

Figures 4, 5:
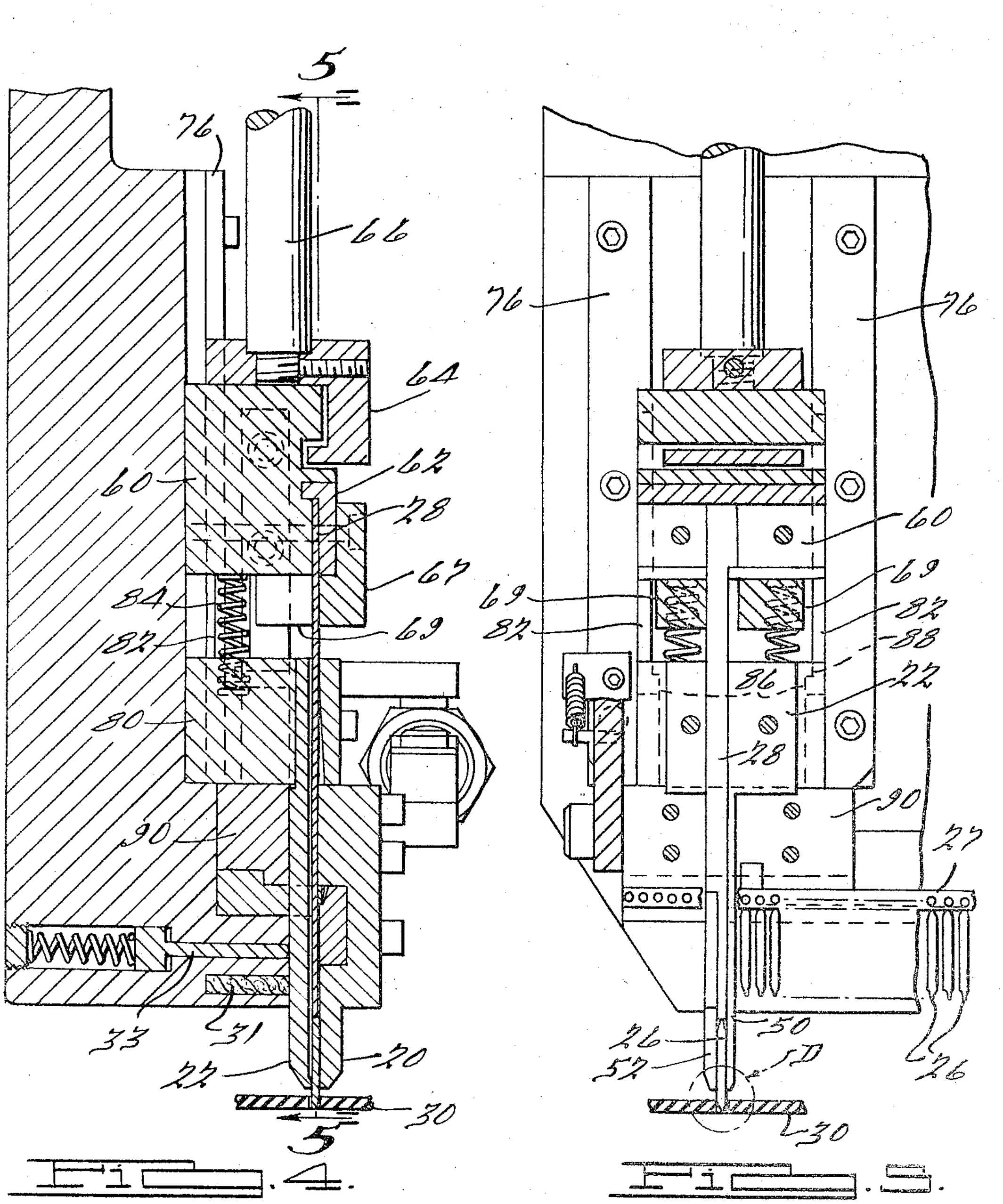
FIG. 4 is an enlarged fragmentary sectional view taken on the line 4—4 of FIG. 1.
FIG. 5 is a sectional view taken on the line 5—5 of FIG. 4.
Figure 11:
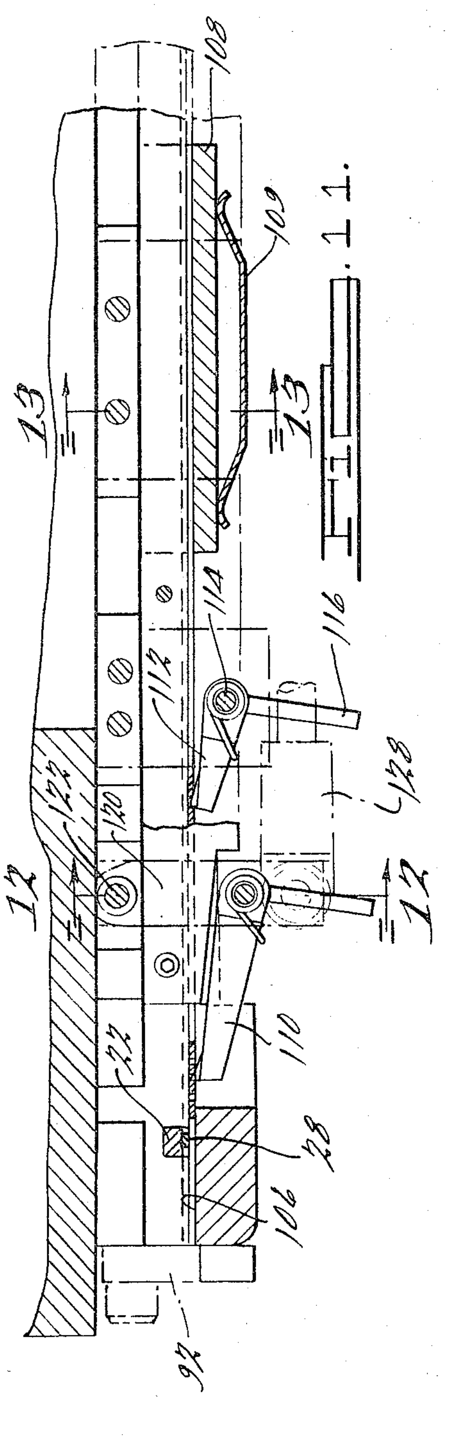
FIG. 11 is an enlarged sectional view taken along the line 11—11 of FIG. 1.
Figure 13:
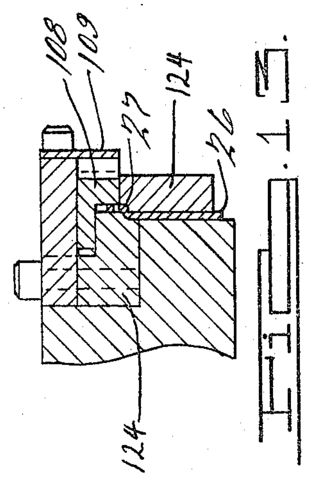
Figure 12:
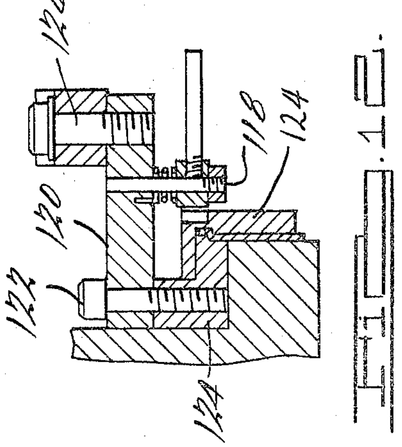
Figure 14:
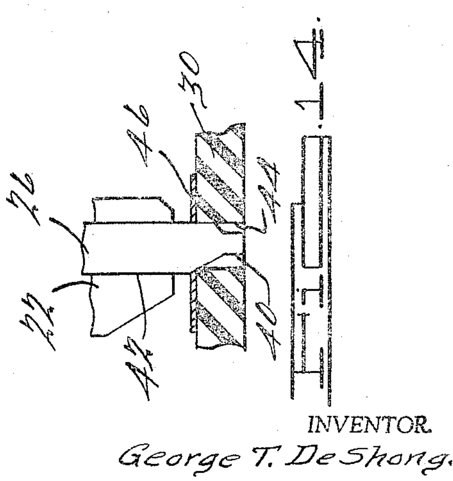
Figure 15:
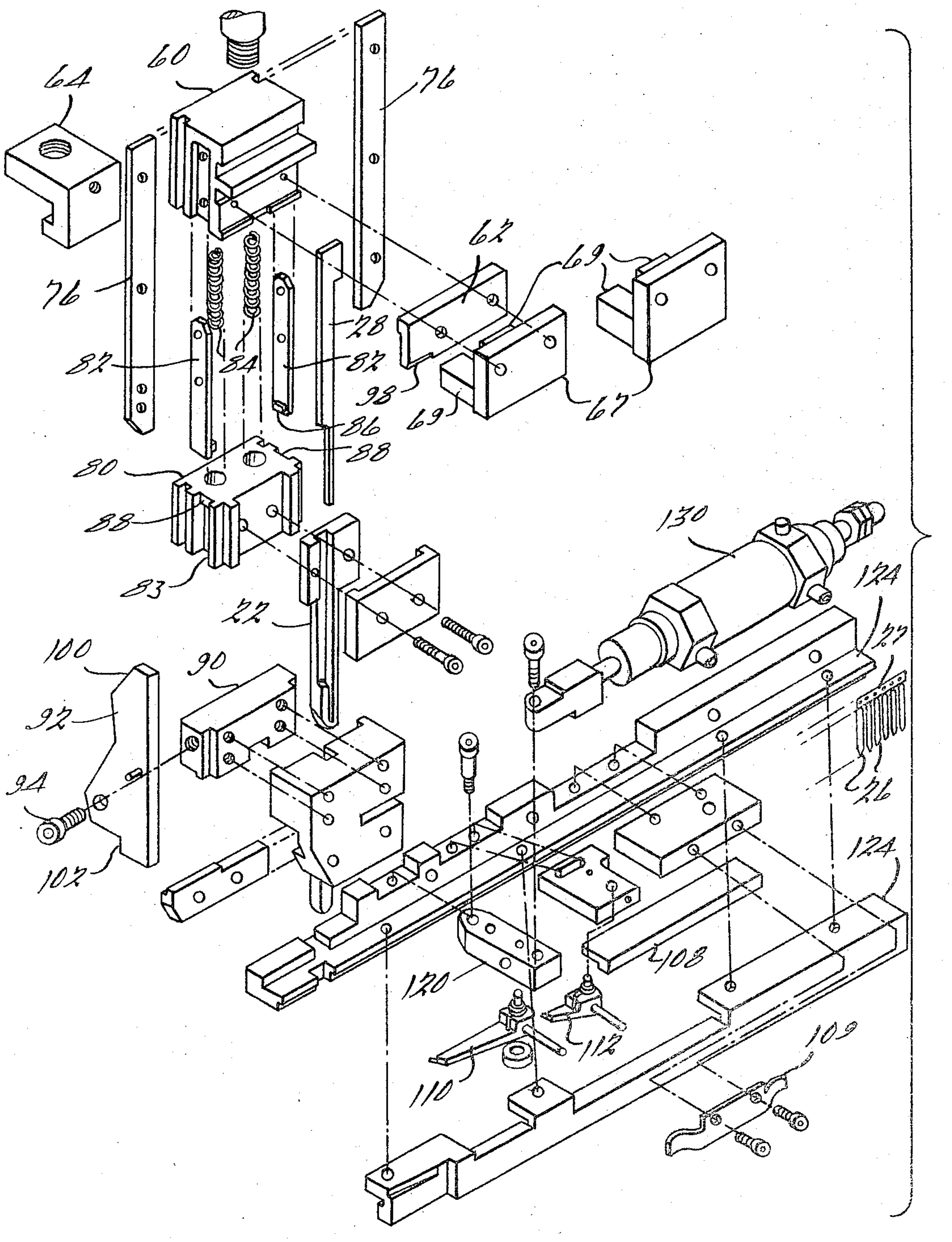
Figure 16:
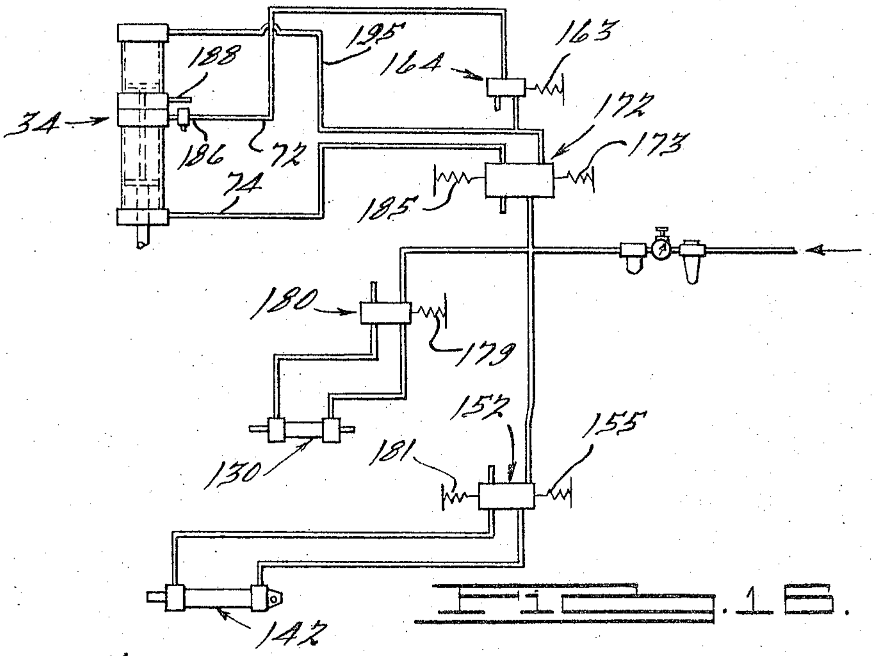
Figure 17:
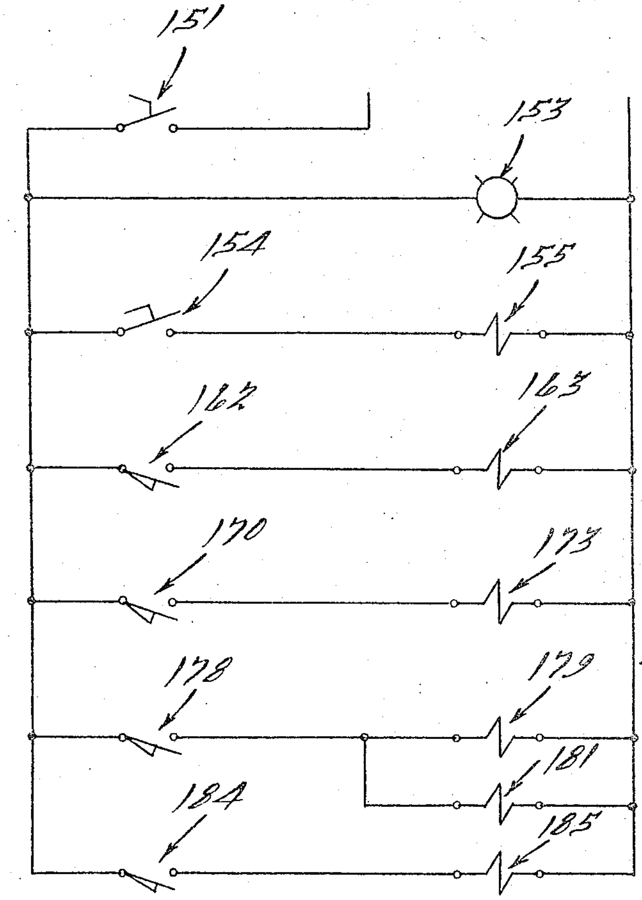

FIGS. 12 and 13 are sectional views taken along the lines 12—12 and 13—13 respectively of FIG. 11;

FIG. 14 is an enlarged view of the parts shown in circle D of FIG. 5 and showing the terminal pin in its pilot position;

FIG. 15 is an exploded view of the parts which make up the feed mechanism, the supporting jaws, the punch, and the carrier cutoff;

FIG. 16 is a schematic circuit diagram of the pneumatic circuit and controls for the pneumatic cylinders; and FIG. 17 is a schematic view of the electric control circuit of the press.

In accordance with my method, I sever the lead pin of a strip of terminal pins 26 from the strip and support and position such pin so that the lead end thereof is free to function as a pilot. Preferably, the pin is vertically supported so that the lead end thereof projects freely downwardly as illustrated in FIG. 5 whereby the operator can see the lead end of the pin and use it as a guide while shifting the circuit board for piloting the hole therein over the pin, as shown in FIG. 5.

The circuit board is then moved upwardly on the pin so as to force the hole in the board over the main diameter portion of the pin and then, while the circuit board is held by the anvil of the press adjacent the supporting jaws for the pin, the pin is driven further into the hole in the board so as to accurately position the pin in the hole where it is held by frictional contact. As soon as the press is opened, the circuit board may be moved so as to bring another hole in the board into position for the application of a pin thereto while the press is shifting the next pin from the carrier into the pilot position.

Figure 9:
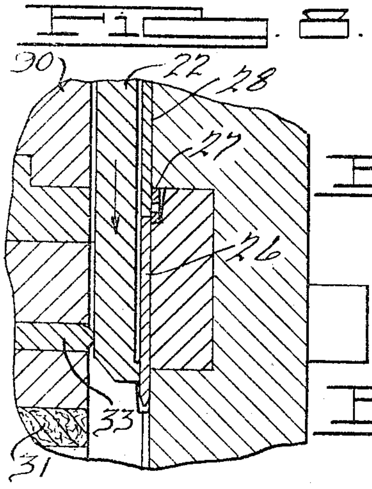
FIG. 9 is an enlarged sectional view taken in a plane corresponding with that of FIG. 4 and illustrating the step of shearing the lead terminal from its carrier strip.

The press type apparatus as illustrated in the drawings comprises in general jaws 20 and 22 for holding and vertically supporting a terminal pin 26 for movement lengthwise thereof, feed and guide mechanism indicated generally at 24 for feeding a series of parallel terminal pins 26 on a carrier strip 27 one by one between the jaws so as to position the lead pin 26 on the carrier 27 in a severing position as illustrated in FIG. 9, a punch 28 associated with the jaws and operable for severing the lead pin 26 from the carrier strip 27, and for moving the severed pin lengthwise of the jaws so that the lead end of the pin projects downwardly from the jaws as illustrated in FIG. 5 to form a pilot for the circuit board 30. A back-up anvil 32 is disposed opposite to and in line with the jaws and operable to apply pressure in the direction of the jaws against a circuit board disposed transversely between the anvil and the jaws so as to force the board onto the major diameter portion of the pin. Air cylinder means 34 operate the punch so as to cause it to drive the pin projecting from the lower end of the jaws into the board so as to accurately position the pin on the board.

Figure 8:
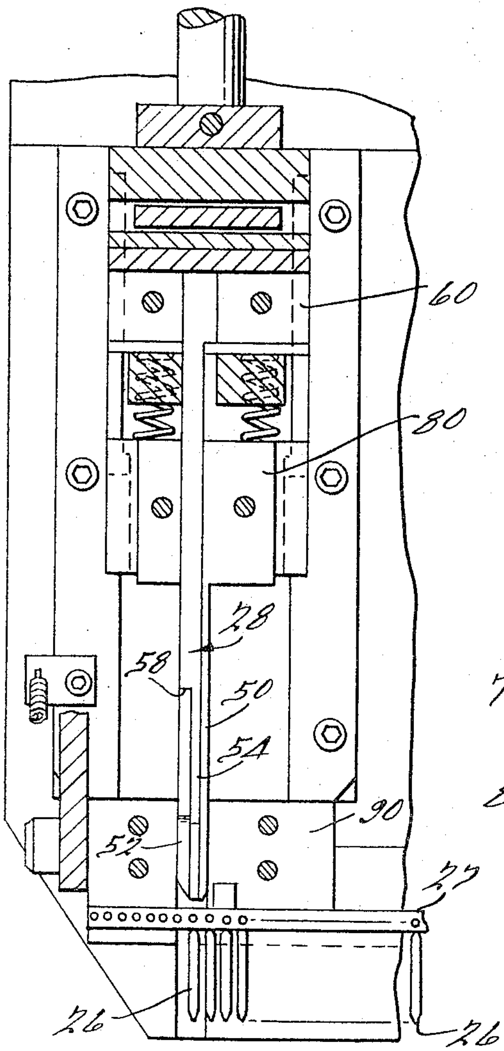
FIG. 8 is a fragmentary sectional view similar to FIG. 7 and showing the strip of pin terminals in position for the next cycle of operation.

The anvil 32 and its operating mechanism are suitably mounted on the base of a press type frame 36 so that the anvil 32 projects upwardly while the jaws 20 and 22 are mounted on the upper part of the frame so that they project downwardly toward and in line with the anvil 32. The frame is provided with an opening 38 therein into which the anvil 32 and the jaws 20 and 22 project and so that a circuit board may be positioned below the jaws and above the anvil 32. As illustrated, the apparatus is adapted for manual operation under the control of an operator who manually positions the circuit board 30 for the application of a terminal pin thereto, although I contemplate that a mechanized feed could be provided or the circuit board. However, the machine is particularly adapted for use by an operator who will use the downwardly projecting lead end of the terminal pin 26 as a fixed pilot while the circuit board 30 is shifted to bring the hole therein into registration with the terminal pin depending from the jaws 20 and 22. The jaw 20 is fixed while the back jaw 22 is movable between its pilot position as illustrated in FIGS. 4 and 5, and its retracted position as illustrated in FIG. 8.

Starting with the parts arranged as illustrated in FIGS. 4 and 5, the terminal 26 is held in its pilot position by the jaws 20 and 22 so that the lower lead end of the terminal is free. As shown in FIG. 14, the lead end 40 of the terminal is of reduced cross section relative to the main diameter portion 42 so that the lead portion will freely enter the hole 44 in the printed circuit board 30, which has current conductors 46 and 48 printed or otherwise affixed thereto, the conductors overlapping the holes 44. The size of the holes 44 and the corresponding openings in the conductors is less than the major diameter portion 42 of the pin 26 so that when the hole 44 in the board 30 is forced over the major diameter portion 42 of the pin, it will be securely anchored in the board 30 and in current conducting contact with the conductors 46 or 48 which form an integral part of the board 30.

The punch 28 is disposed between the jaws 20 and 22, the jaw 22 being provided with an elongated rib 50 along one side thereof and a short rib 52 on the other side thereof which form guides for the tool end 54 of the punch and the pin 26 as they move relative thereto. The upper end of the punch 28 is clamped between and secured to block 60 and plate 62 which, together with bracket 64, form a head 65 to which the piston rod 66 is connected by a shiftable linkage in order to adjust for any differences in alignment between the piston rod and the head. Bracket 67 is secured to head 65 and provides spacers 69 positioned under the head. The spacers limit the downward travel of the punch by bottoming on the upper surface of block 80 as shown in FIG. 6.

The rod 66 at its upper end is provided with a piston 68 which works in cylinder 70. Air lines 72 and 74 connected to the ends of the cylinder 70 form part of a means for supplying air under pressure to the opposite ends of the cylinder 70 whereby the piston 68 may be moved in both directions so as to position and move the punch 28. During the cycle of the press, the punch 28 moves from the pilot position shown in FIGS. 4, 5 and 6 down to the pin inserting position of FIG. 7, and then up to the retracted position of FIG. 8.

Parallel guides 76 cooperate with slots in the block 60 for guiding the latter in its reciprocable movement. The block 60 has a lost motion connection with block 80 to which the back jaw 22 is secured so as to move therewith. The guides 76 also cooperate with slots in the block 80 for guiding the same during its vertical movement. The lost motion connection between the block 60 and the block 80 comprises a pair of parallel arms 82 fixed to the sides of the block 60 and projecting downwardly therefrom and a pair of springs 84, the lower ends of the arms 82 on the inside thereof each being provided with a shoulder 86. The shoulders 86 are engageable with corresponding shoulders 88 projecting laterally from the block 80 so as to cause the block 80 to travel upwardly with the block 60 when the shoulders 86 and 88 engage, while permitting downward movement of the block 60 relative to the block 80 when the latter is bottomed on the block 90 which forms a mounting pad for the fixed jaw 20.

Figures 6, 7:
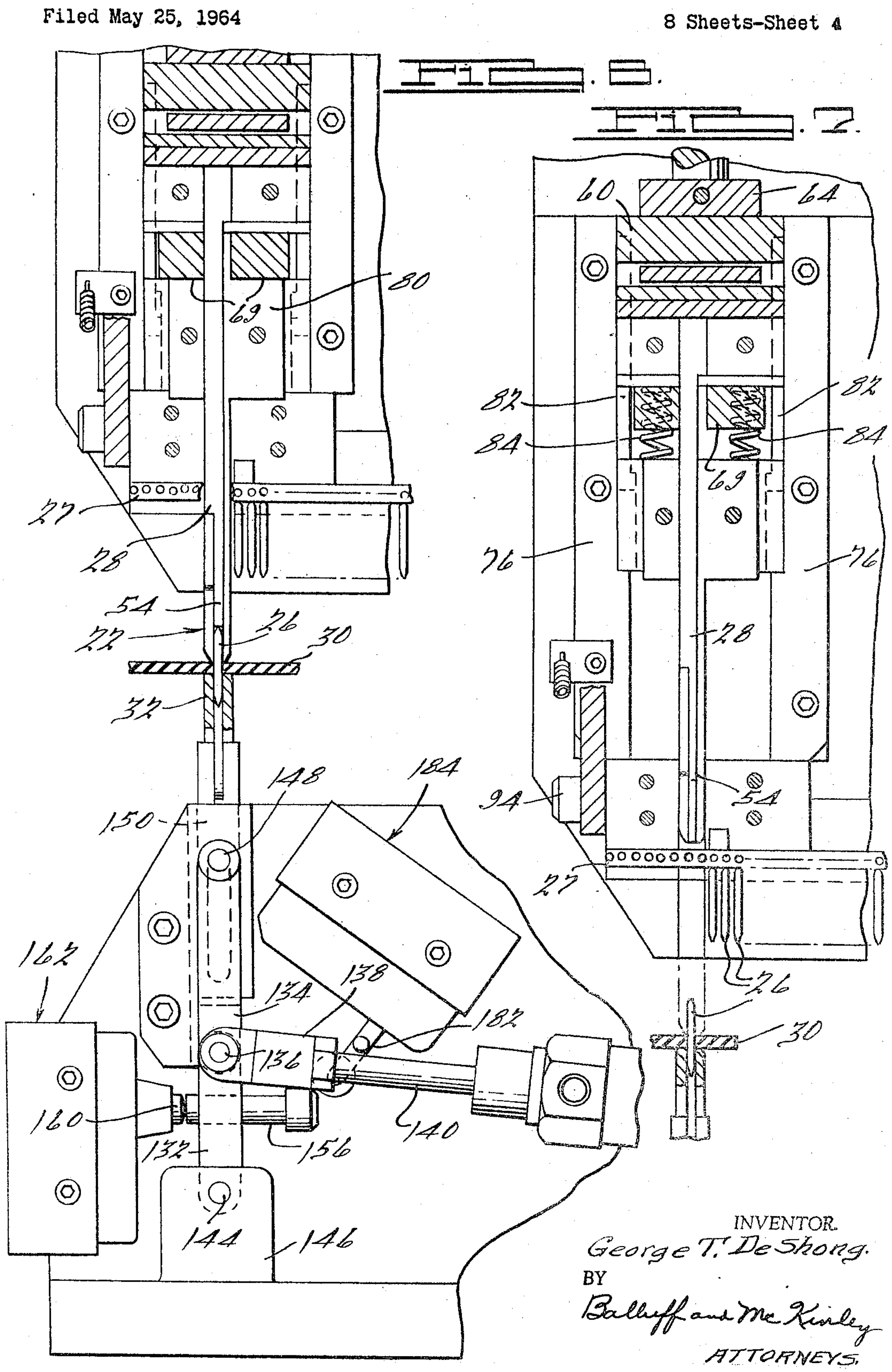
FIG. 6 is a sectional view similar to FIG. 5 but showing the press with the anvil and punch in their extended positions.
FIG. 7 is a fragmentary view similar to FIG. 6, but showing the punch and movable jaw of the press in their retracted positions.

Thus, with the block 80 bottomed on the block 90 as illustrated in FIG. 4, the block 60 is free to move downwardly against the compression of the springs 84 and thus move the punch 28 downwardly relative to the jaws 20 and 22 from the position as illustrated in FIGS. 4 and 5 to that illustrated in FIG. 6. Spacers 69 limit the downward movement of block 60 relative to block 80 by bottoming on block 80. From FIG. 15 it will be evident that the downwardly projecting arms 82 are disposed in slots 83 in the block 80.

In moving from the position illustrated in FIGS. 4 and 5 to that of FIG. 6, the punch 28 applies pressure to the upper end of the pin 26 to move it lengthwise thereof relative to the jaws 20 and 22 and to the board 30 so as to accurately position the pin 26 in the hole in the board. The depth to which the pin 26 is driven in the hole 44 is determined by the thickness of the spacers 69. As shown in FIG. 15, alternate brackets 67 with different thickness spacers 69 may be provided. If a thinner spacer is used, the punch 28 descends further between the jaws 20 and 22 and drives the pin 26 further into the hole 44. Before the punch 28 is driven to the position illustrated in FIG. 6, the anvil 32 is moved upwardly to its position as illustrated in FIG. 6 for applying pressure against the lower surface of the board 30 so as to move the board 30 from the position in which it is illustrated in FIG. 5 toward jaws 20 and 22 and axially of the pin 26 so as to force the hole in the board over the major diameter portion 42 of the pin 26. Depending upon the thickness of the circuit board 30, the anvil may position the board against the lower ends of jaws 20 and 22 as shown in FIG. 6. When a thinner circuit board is used, the advance stroke of the anvil will move the board onto the pin, but not against the jaws 20 and 22.

As illustrated in FIG. 6, the anvil 32 comprises a hollow tubular member to accommodate that portion of the pin 26 which projects below the board 30 to permit the anvil 32 to cooperate with the pin and the jaws 20 and 22 so as to securely hold the board 30 when the punch 28 moves downwardly so as to drive the terminal pin home, that is, to its proper position in the hole in the board 30. Thereafter the air cylinder means 34 is energized so as to upwardly retract the back jaw 22 and the punch 28 to the position as illustrated in FIG. 7. A lubricant wick 31 embedded in the base of the press lubricates jaw 22. Spring biased drag 33 forces jaw 22 against jaw 20 to securely hold the pin 26 as it is moved therebetween.

Figure 10:
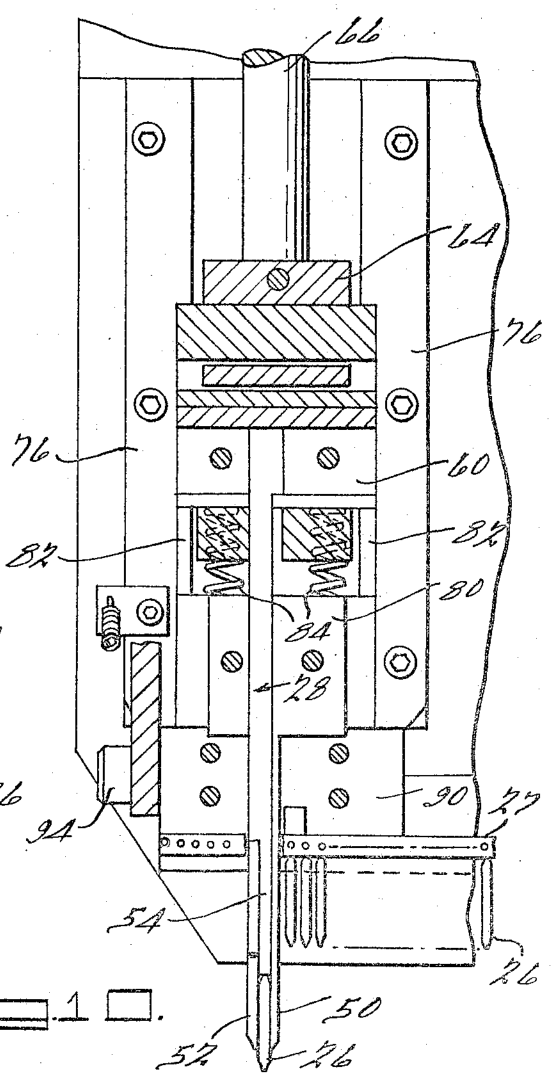
FIG. 10 is a fragmentary sectional view similar to FIG. 8 but showing the lead terminal in its pilot position.

When the jaw 22 and punch are fully retracted, the anvil 32 is downwardly retracted whereby the board and the newly inserted terminal pin are free of the anvil 32 and the jaws 20 and 22 so as to enable the operator to shift the board 30 relative to the fixed jaw 20 so as to bring another hole in the board 30 into registration with the pin to be fed between the jaws 20 and 22, with the completion of the cycle of the press. While the operator is doing this, the feed mechanism 24 is actuated to move the next terminal pin into shearing position (FIG. 9), and the air cylinder means 34 is energized so as to move the back jaw 22 and punch 28 from the retracted position of FIG. 7 and to cause the punch 28 to shear the lead terminal from the carrier strip 27 and to position it in its pilot position between the jaws 20 and 22 as illustrated in FIG. 10 for the next cycle of operation.

Referring to FIG. 9, it will be noted that the carrier strip 27 is offset from the pins 26 which are integrally connected thereto in parallel relation and so that when the punch 28 descends it will shear the pin 26 from the carrier strip 27. This leaves the carrier strip 27 intact. However, as successive pins 26 are advanced to the shearing position (FIG. 9), the carrier strip 27 is fed to a cutoff mechanism which comprises a cutter 92 pivoted to the block 90 by pin 94. Spring 96 biases the cutter 92 so that the cutting edge thereof is normally in its retracted position.

On the final portion of the downstroke of the press an abutment 98 on plate 62 engages a cam surface 100 on the cutter 92 for shifting the same in a clockwise direction so that the cutting edge 102 will cut off the part of the carrier strip 27 which projects into the path of the cutter 92.

As shown in FIGS. 11, 12 and 13, the strip of terminals 26 is fed by the feed mechanism through a guide which defines a path 106 conforming essentially to the cross section of the carrier strip 27 and the pins 26 as illustrated in FIGS. 12 and 13. This path 106 intersects the path of the punch 28 as illustrated in FIG. 9 so as to present the lead terminal in a position for severance by the punch 28 from the strip 27. A drag 108 is loaded by spring 109 as illustrated in FIGS. 11 and 13 to react on the carrier strip 27 so as to stabilize its travel.

The strip of terminals preferably is fed from a reel to the press. The feed mechanism 24 includes pawls 110 and 112 engageable with the pilot holes in the strip 27, pawl 112 serving to prevent accidental reverse movement of the strip of terminals. The pawl 112 is pivoted at 114 and forms a part of a bell crank 116 so as to permit the pawl 112 to be disengaged from the carrier strip 27 when desired. The pawl 110 is pivoted by a pin 118 to a link 120 which is pivoted by a pin 122 to one of the guide bars 124 which form the path 106. The outer end of the link 120 has a pivotal connection 126 with a link 128 which is the piston rod of the piston of a double acting air cylinder 130 shown in FIG. 1, whereby the link 120 may be oscillated so as to actuate the pawl 110 to advance the strip of terminals one by one into the path of the punch 28 for the servering operation as illustrated in FIG. 9. As will be explained more fully hereafter, the feed mechanism is actuated when the punch 28 is in its retracted position (FIG. 7) to move the lead terminal into position for severance from the strip 27.

Figure 1:
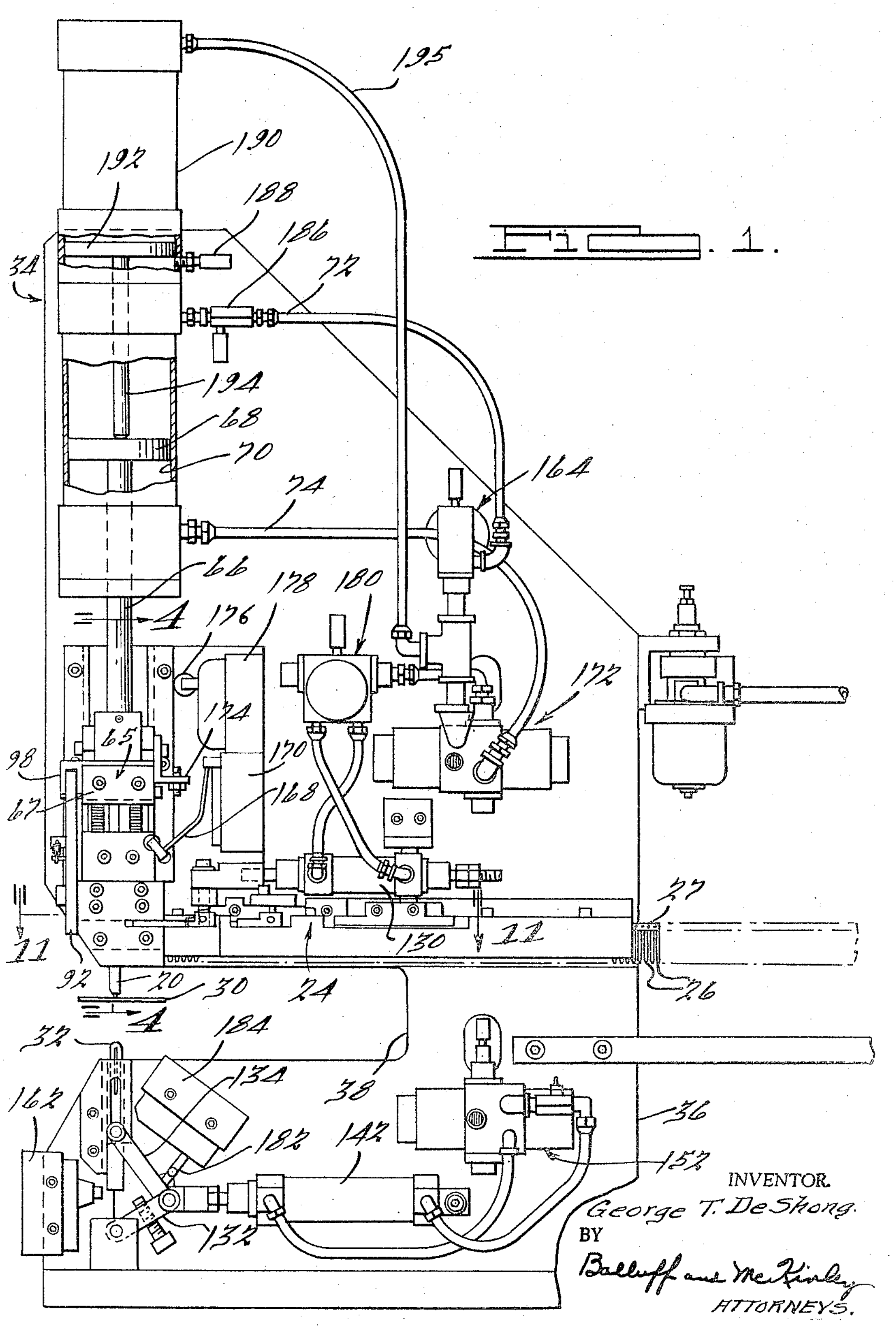
FIG. 1 is a side elevational view, with parts broken away, of a press type apparatus for applying terminal pins to printed circuit boards.
Figures 2, 3:
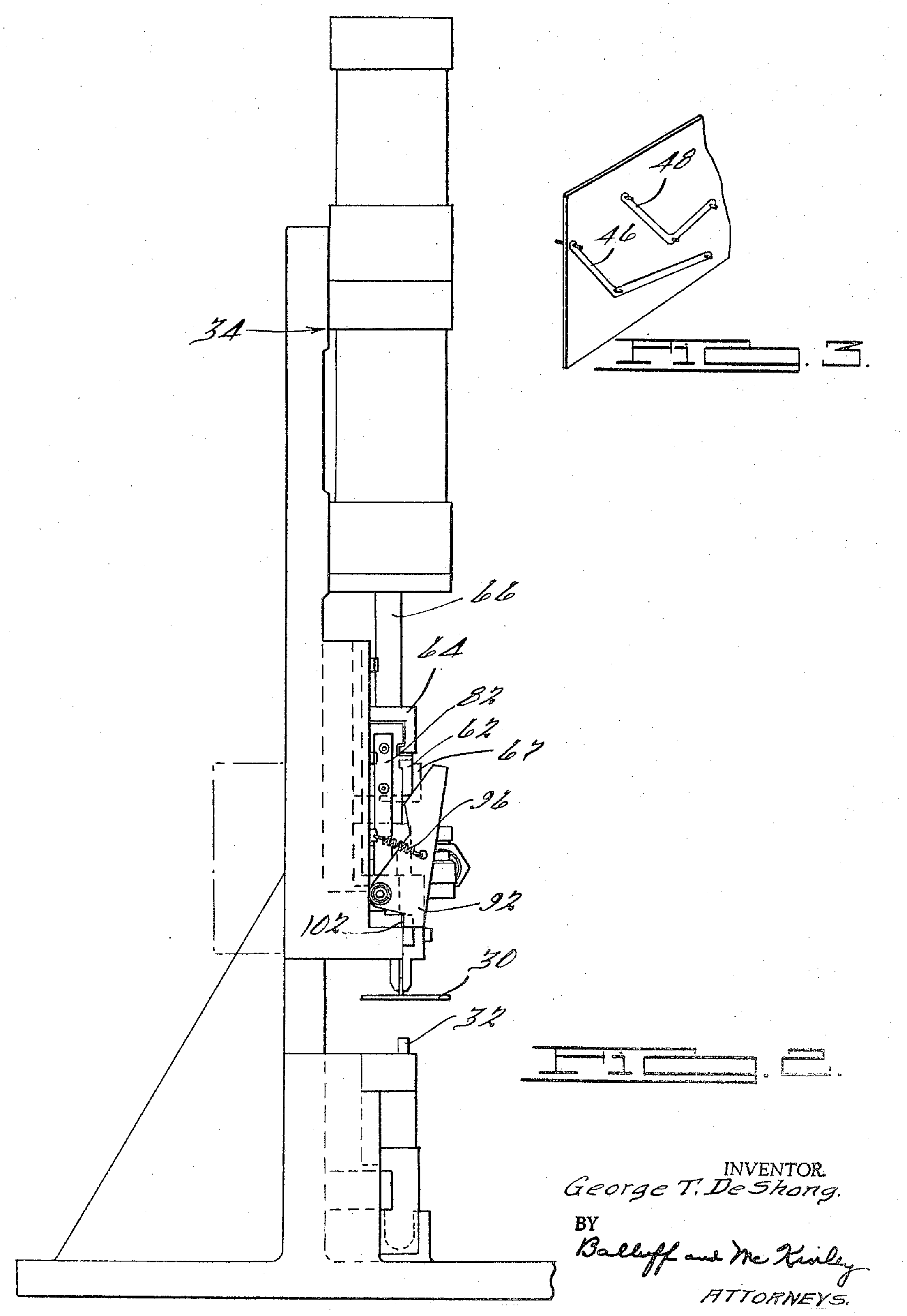
FIG. 2 is a front elevational view of the apparatus.
FIG. 3 is a fragmentary perspective view of a circuit board to which several terminal pins have been applied.

The anvil 32 is movable from its retracted position as shown in FIG. 1 to its extended position as shown in FIG. 6 by a toggle mechanism which includes links 132 and 134 which are connected by pin 136 and bracket 138 to a piston rod 140 of the double acting air cylinder 142. The link 132 is pivoted at 144 to a fixed bracket 146 while the link 134 is connected by pin 148 to the anvil 32 which is vertically movable in the guide 150. The opposite ends of the double acting air cylinder 142 are supplied with air under pressure under the control of a conventional solenoid valve indicated generally at 152, the valving arrangement being such that when air under pressure is supplied to one end of the cylinder 142, the other end is ported to atmosphere.

The circuit for the solenoid valve 152 is normally open and is adapted to be closed by a foot-operated, normally open switch 154 under the control of the operator. An on-off power switch 151 is manually operated to energize the press so that when the operator steps on foot switch 154 the press will sequentially run through its complete cycle. A pilot lamp 153 indicates when switch 151 is on and the machine is ready for actuation. At the beginning of the cycle of operation the press is in the pilot position as shown in FIGS. 1, 2, 4 and 5. Momentary closing of the switch 154 will energize solenoid 155 of valve 152 so as to energize the air cylinder 142 to close the toggle and shift the anvil from the position of FIG. 1 to that of FIG. 6. Before this occurs, the operator has already positioned the circuit board 30 over the lead end of the pin as illustrated in FIG. 14. Movement of the anvil 32 to its extended position will force the hole in the board over the major diameter 42 of the pin 26 and shift the board 30 up against the lower ends of the jaws 20 and 22 as illustrated in FIG. 6.

As the anvil moves toward its extended position, an element 156 carried by the link 132 engages the actuating member 160 of a normally open switch 162 to close the same for the period the anvil is extended and thus complete the circuit through solenoid 163 of a normally closed solenoid operated valve 164 which permits air under pressure to pass through valve 164, air line 72, and into the upper end of air cylinder 70 for moving the piston 68 thereof downwardly and so as to cause the punch 28 to move from the pilot position illustrated in FIGS. 4 and 5 to that illustrated in FIG. 6 where spacers 69 of block 60 are bottomed on block 80 and the punch is fully extended downwardly between the jaws 20 and 22. In doing so, the punch 28 drives the pin 26 home into the hole 44. As this occurs, a bracket 67 on the head 65 engages the actuating arm 168 of a normally open switch 170 so as to close the same. This closes the circuit through solenoid 173 of a solenoid operated valve 172 which opens the line 74 to the air pressure supply so as to supply air under pressure to the cylinder 70 on the under side of the piston 68 for raising the same to its upper position, thus moving the punch and the jaw 22 to their retracted positions as shown in FIG. 7. The entrapped air above piston 68 is vented to atmosphere through a one-way vent valve 186 as the piston is raised to the fully extended position. When the piston 68 is raised, it contacts and raises piston 192, located in cylinder 190, by abutting against and raising piston rod 194 of piston 192. Piston 68 however is not secured to piston rod 194. Air line 195 is then vented to atmosphere through valve 172 to release the entrapped air above piston 192. The lower portion of cylinder 190 is vented directly to atmosphere at 188. As the press rises, bracket 67 retracts from arm 168 and switch 170 opens, deactivating solenoid 173.

As the press rises, an abutment 174 mounted on the head 165 trips the actuating arm 176 of a normally open switch 178 which energizes solenoid 179 of a solenoid actuated normally closed valve 180 which controls the supply of air under pressure to the double acting air cylinder 130 for effecting the feed stroke of the feed mechanism so as to position the lead terminal in the path of the retracted punch 28. Closing of the switch 178 also closes the circuit through solenoid 181 of the solenoid operated valve 152 which energizes the air cylinder 142 so as to effect the retractile stroke of the anvil 32 and open switch 162, thereby closing valve 164. The toggle link 134, upon being retracted, engages the switch actuating arm 182 of a normally open switch 184 which momentarily closes the circuit through solenoid 185 of a solenoid operated valve 172 which reverses valve 172 so as to supply air under pressure to the upper end of a cylinder 190 so as to effect the advance stroke of the piston 192. The piston rod 194 of the piston 192 reacts on the piston 68 so as to advance the same to effect the severing of the lead terminal from the strip 27 and to position the lead terminal in its pilot position as illustrated in FIGS. 1, 4 and 5. As the press advances back to the pilot position, switch 178 is opened and solenoids 179 and 181 are deenergized. Switch activating arm 182 is provided with a hinge so that it does not actuate switch 184 as the anvil is advanced. The press has now completely cycled and is inactive until foot switch 154 is again tripped by the operator.

In view of the foregoing, it will be evident that the closing of the foot-operated switch 154 by the operator initiates a cycle of operation which will insert a pin in a hole in a circuit board. At the end of this cycle the press will be conditioned for another cycle. The air cylinders, the pistons, the solenoid valves for controlling the same, and the switches which control the solenoid valves are constructed and arranged so that a complete cycle is carried out in about one second or less.

While I have illustrated and described a preferred embodiment of my invention, it is understood that this is capable of modification, and I therefore do not wish to be limited to the precise details set forth but desire to avail myself of such changes and alterations as fall within the purview of the following claims.

I claim:

1. That method of securing a terminal pin to a circuit board having a hole therein which comprises vertically supporting the upper end of such pin by supporting means so that the lower end of said pin projects downwardly from said supporting means and is freely exposed as a pilot for attachment to said circuit board positioning said board while transversely disposed below said pin so as to align said hole with said pin, raising said board so as to position the rim of the hole therein around said pin, applying pressure against the lower surface of said board .round said hole so as to move said board toward said upporting means and axially of said pin and, while said ›oard is supported against said pin, applying pressure to aid pin for moving it lengthwise thereof relative to said ›oard so as to accurately position said pin in said hole.

2. That method of securing the lead pin of a strip of erminal pins to a circuit board having a hole therein vhich comprises severing such lead pin from the strip vhile vertically supporting such pin so that the lower end ›f said pin is freely exposed as a pilot, positioning said ›oard below and transversely of said pin so as to align aid hole with said pin, raising said board so as to posiion the rim of the hole therein around said pin, movng said board aixally of said pin so as to frictionally ecure said pin in said hole, and applying pressure to aid pin for moving it lengthwise thereof relative to said ›oard so as to accurately position said pin in said hole.

3. That method of securing a terminal pin having a ead end to a circuit board having a hole therein which :omprises supporting such pin so that the lead end of said ›in is exposed as a pilot for attachment to the circuit ›oard, positioning said board transversely of said pin so ıs to align said hole with said pin, moving said board ;o as to position the rim of the hole therein around the ead end of said pin, applying pressure against said board ;o as to move said board axially of said pin to force he hole in the board over the major diameter portion ›f the pin, and holding said board while applying pres.ure to said pin for moving it lengthwise thereof relative .o said board so as to accurately position said pin in said ıole.

4. That method of securing a terminal pin to a circuit ›oard which comprises stripping a terminal pin from a :arrier strip, axially moving the pin to an insertion posi.ion where the pin is vertically held in a holder with a ›ortion of the pin extending from the holder and ex›osed as a pilot, positioning an apertured circuit board ıdjacent the pin and in transverse relation thereto with an aperture in approximate axial alignment with the pin, moving the board toward the pin and pin holder to position the aperture around the pilot portion of the pin for precise alignment therewith, and moving the pin away from the pin holder and into the aperture while the board is held against the pin holder.

5. That method of securing a terminal pin in a hole in a circuit board which comprises providing a freely exposed and downwardly projecting pilot, positioning said board while transversely disposed below said pilot so as to align said hole with said pilot and moving said board toward said pilot so as to pilot said hole on said pilot, supporting the board, and while said board is so supported moving a pin axially downwardly relative to said board so as to accurately position said pin in said hole.

6. That method of securing the lead pin of a strip of terminal pins in a hole in a circuit board which comprises severing such lead pin from the strip so that the lead end of said pin extends downwardly and is freely exposed for attachment to said circuit board, positioning said board below and transversely of said pin so as to align said hole with said pin, and moving said pin axially in the direction of said board a predetermined distance from said strip so as to accurately position said pin in said hole with the ends of said pin projecting predetermined amounts from said board.

References Cited by the Examiner

UNITED STATES PATENTS

| | | | |
|---|---|---|---|
| 2,748,452 | 6/1956 | Pierce | 29—413 X |
| 2,766,516 | 10/1956 | Chantler | 29—413 |
| 2,805,471 | 10/1957 | Lowden | 29—155.5 |
| 2,877,541 | 3/1959 | Bishop et al. | 29—203 |
| 2,959,848 | 10/1960 | Savitt | 29—407 |

JOHN F. CAMPBELL, *Primary Examiner.*

THOMAS H. EAGER, *Examiner.*